(12) United States Patent  (10) Patent No.: US 6,585,828 B1
Kurita et al.  (45) Date of Patent: Jul. 1, 2003

(54) PROCESS CHAMBER LID SERVICE SYSTEM

(75) Inventors: Shinichi Kurita, San Jose, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 291 days.

(21) Appl. No.: 09/670,481

(22) Filed: Sep. 26, 2000

(51) Int. Cl.[7] .......................... B08B 9/00; B65B 65/23; B65F 7/00
(52) U.S. Cl. ..................... 134/8; 134/42; 414/401; 414/411; 414/940
(58) Field of Search ................. 134/8, 42; 414/411, 414/401, DIG. 940

(56) References Cited

U.S. PATENT DOCUMENTS

| | | | | |
|---|---|---|---|---|
| 4,228,864 A | * | 10/1980 | Berger et al. | 177/145 |
| 4,378,188 A | * | 3/1983 | Hardwick | 298/23 C |
| 5,683,220 A | * | 11/1997 | Oh et al. | 414/401 |
| 6,089,812 A | * | 7/2000 | Junker | 414/396 |
| 6,106,213 A | * | 8/2000 | Denker | 414/217 |
| 6,142,722 A | * | 11/2000 | Genov et al. | 414/217 |
| 6,186,738 B1 | * | 2/2001 | Junker | 414/401 |

* cited by examiner

*Primary Examiner*—Randy Gulakowski
*Assistant Examiner*—Saeed Chaudhry
(74) *Attorney, Agent, or Firm*—Adler & Associates

(57) ABSTRACT

Provided herein is a process chamber lid service system comprising a process chamber lid service cart and a process chamber lid service frame. The lid service frame holds the process chamber lid. The cart and the lid service frame are aligned with guide pin and alignment capture, meanwhile, the cart is aligned at the process chamber with guide frame, which is installed at the base frame of the process chamber. This lid service system may be used for opening/closing a process chamber as well as wet-cleaning the process chamber for semiconductor manufacturing.

8 Claims, 6 Drawing Sheets

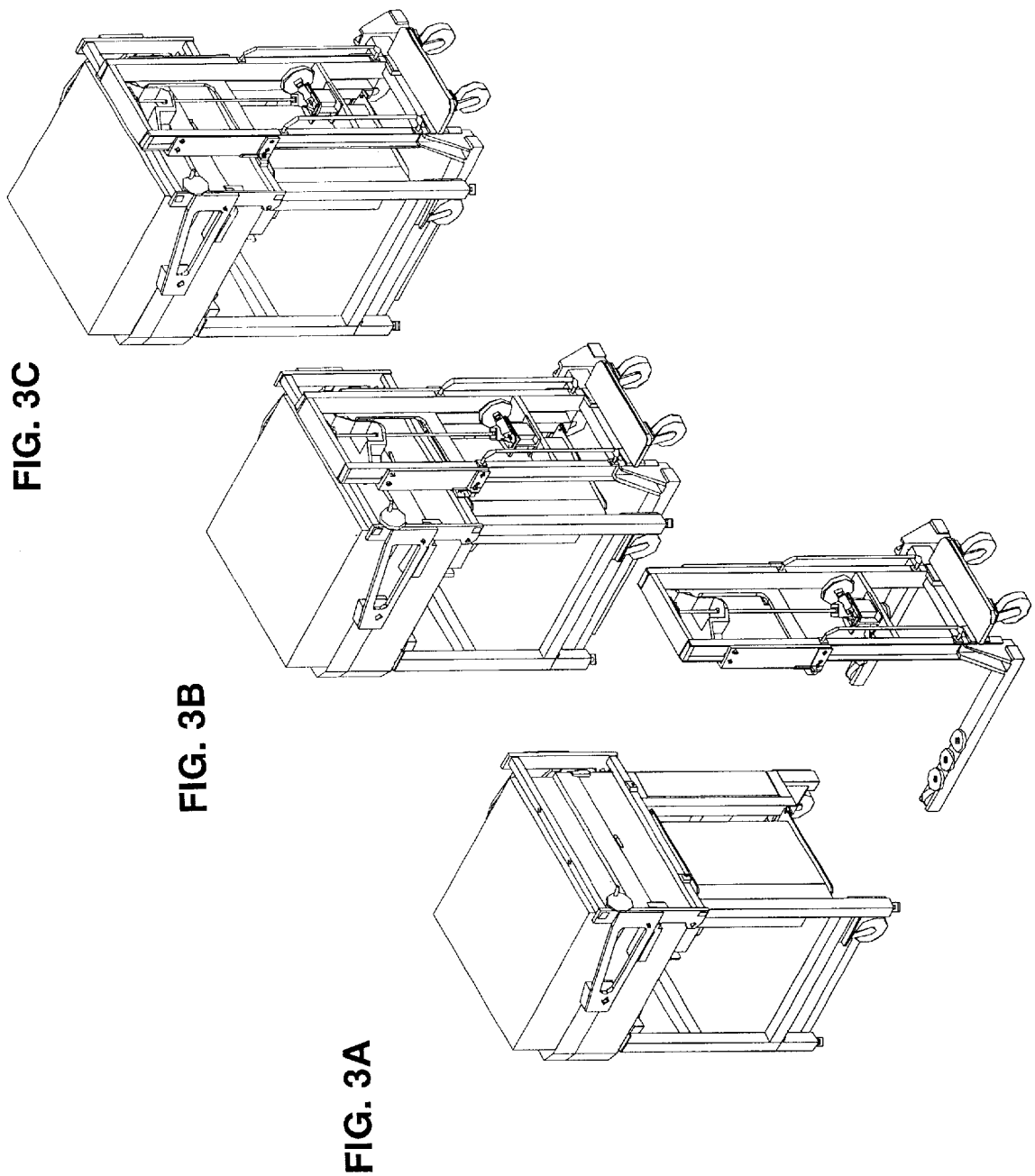

PROCESS CHAMBER LID SERVICE SYSTEM

BACKGROUND OF THE INVENTION

1. Field of the Invention

The present invention relates generally to the field of semiconductor manufacturing. More specifically, the present invention relates to a process chamber lid service system for opening/closing and rotating the lid.

2. Description of the Related Art

During chemical vapor deposition (CVD) processing, reactive gases released inside a process chamber form layers, such as silicon oxides or nitrides, on the surface of a substrate being processed. During this process, oxide/nitride deposition occurs elsewhere in the CVD apparatus. The oxide/nitride residue has a deleterious effect on the CVD process if the CVD apparatus is not periodically cleaned.

To avoid these deleterious effects, periodic cleaning procedures are undertaken to remove the oxide/nitride residue every N wafers/substrates, where N is an integer. The cleaning procedures, however, result in periodic down-time for the CVD system, thereby reducing the system throughput. To reduce the total down-time of the CVD system, two types of cleaning techniques are employed: a gas-clean technique and a wet-clean technique. During a gas-clean technique, a cleaning gas, such as oxygen, $NF_3$, helium and/or nitrogen, is flowed into the process chamber to remove oxide residue present therein. The gas-clean technique is achieved without breaking the vacuum seal of the process chamber, i.e., the seal being formed when a lid associated with the process chamber is in a closed position. This technique minimizes the amount of down-time necessary to perform the cleaning procedure. The gas-clean technique is unable to remove a portion of the oxide residue present in the CVD system, necessitating a periodic wet-clean technique. During a wet-clean technique, the vacuum seal of the process chamber is broken by moving the chamber lid to an open position. A user physically wipes down the chamber using chemical cleaners. Thus, the wet-clean technique is substantially more time-consuming than the gas-clean technique, thereby increasing the down-time of the CVD system.

The prior art is deficient in the lack of effective means of opening/closing and rotating the process chamber lid during semiconductor manufacturing. Specifically, the prior art is deficient in the lack of a process chamber lid service system for opening/closing or rotating the process chamber lid. The present invention fulfills this long-standing need and desire in the art.

SUMMARY OF THE INVENTION

In one aspect of the present invention, provided herein is a process chamber lid service system for semiconductor manufacturing. This system comprises a process chamber lid service cart and a process chamber lid service frame. The lid service frame holds the process chamber lid. The cart and the lid service frame are aligned with a guide pin and alignment capture. The cart is aligned at the process chamber with guide frame, which is installed at the base frame of the process chamber. When the cart and the process chamber base frame are aligned, the left leg of the cart is inserted to the inside of the base frame, while the right leg is placed outside of the base frame.

In another aspect, also provided are methods of opening/closing or even wet-cleaning a process chamber in semiconductor manufacturing using the process chamber lid service system disclosed herein.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIGS. 3A–3H demonstrate process chamber lid service cart operation steps 1–8 (FIGS. 3A–H). The steps are inserting cart (FIG. 3A), aligning cart (FIG. 3B), lifting lid up (FIG. 3C), completing the lid lifting process (to a upper limit) (FIG. 3D), removing the lid (FIG. 3E), lowering the lid (FIG. 3F), rotating the lid (FIG. 3G) and completing the lid rotation (180 degrees) (FIG. 3H).

DETAILED DESCRIPTION OF THE INVENTION

Figure 1A:
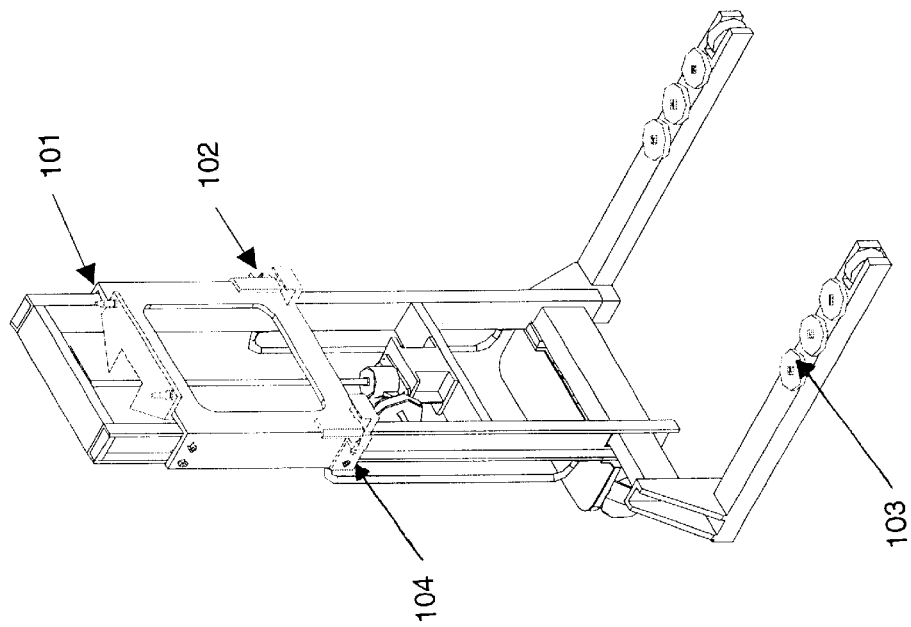
FIG. 1A is an over view of the process chamber lid service cart, comprising guide pin 101, alignment capture 102, wheel 103 and safety pin 104.
Figure 1B:
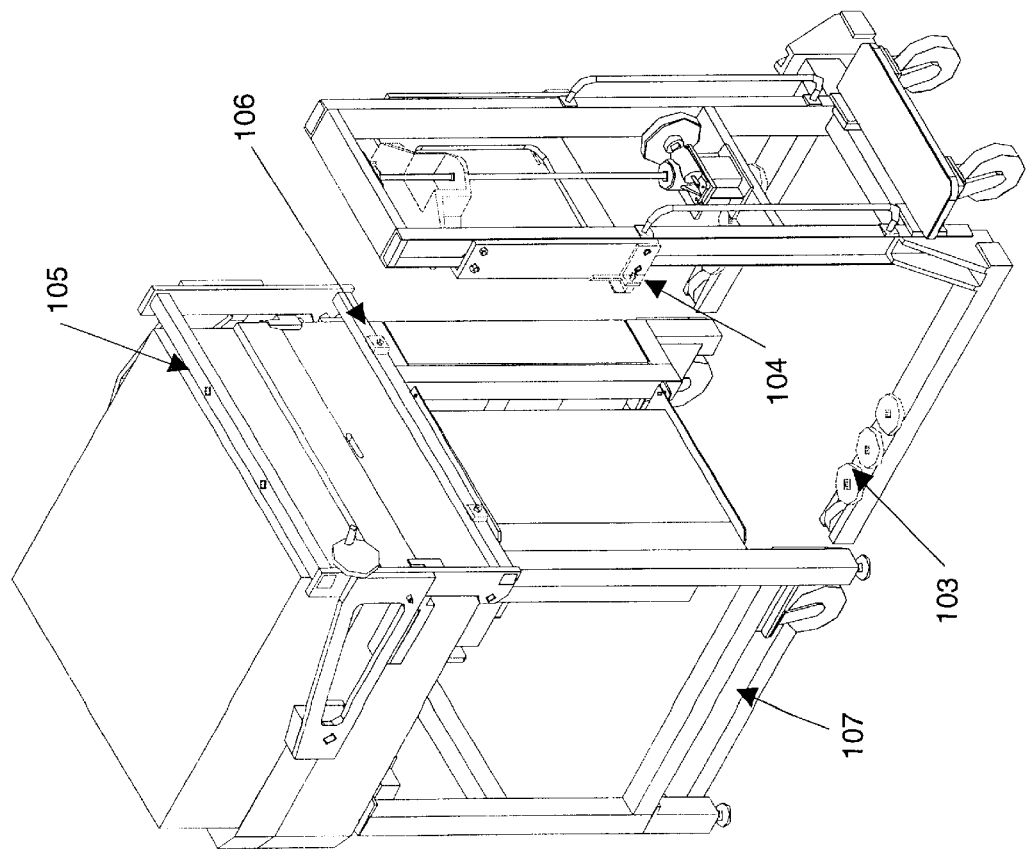
FIG. 1B shows the process chamber lid service system comprising the process chamber lid service cart, process chamber lid service frame and the process chamber. Shown in lid service frame are guide pin hole 105, alignment capture 106, and guide frame 107.
Figure 2:
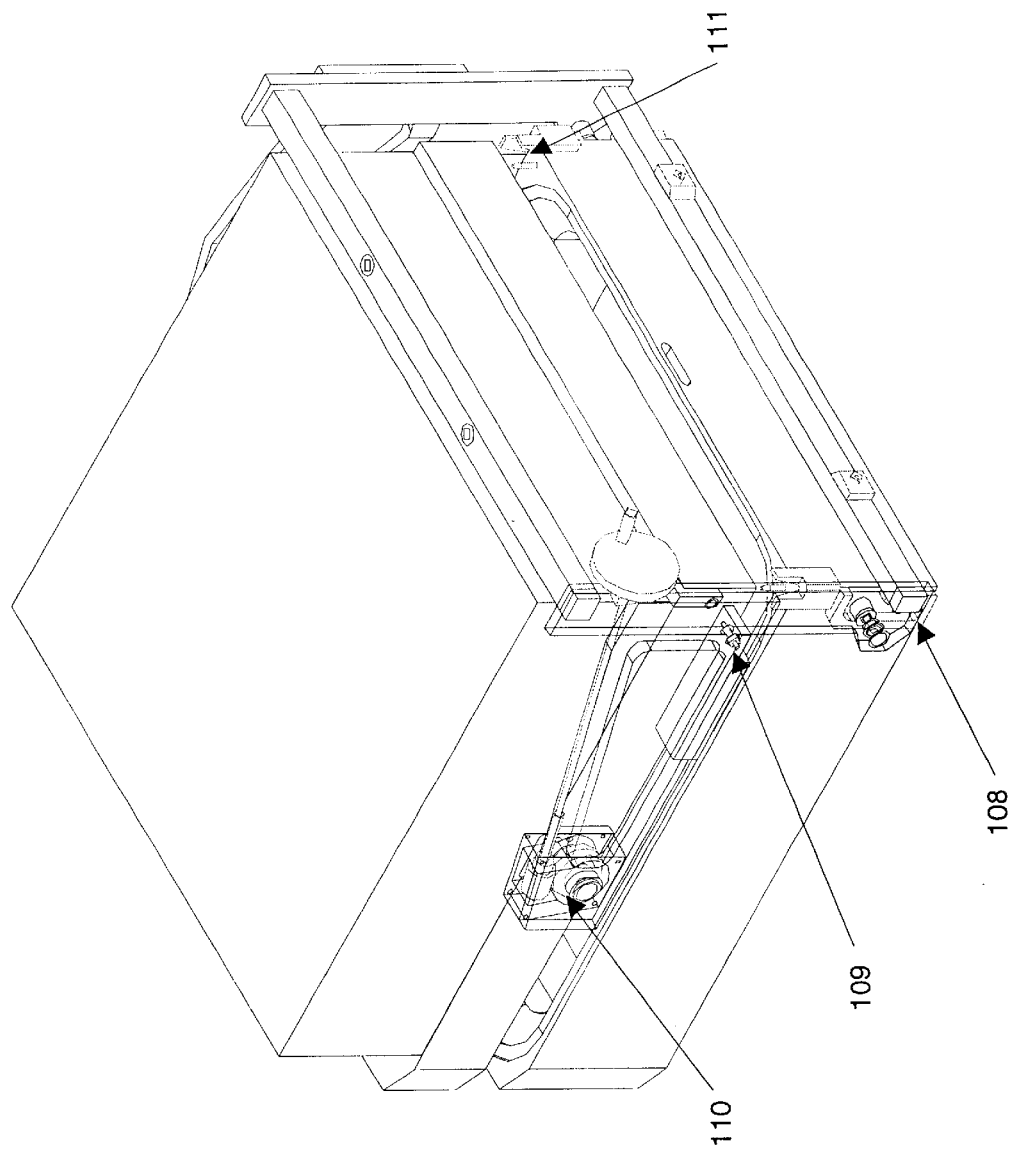
FIG. 2 is an over view of process chamber lid service frame, comprising lid frame guide 108, safety pin 109, worm & wheel 110, and guide & alignment pin 111.

Provided herein is a process chamber lid service system including the process chamber lid service cart and the process chamber lid service frame. The cart comprises guide pin 101, alignment capture 102, wheel 103 and safety pin 104 (FIGS. 1A and 1B). The process chamber lid service frame comprises guide pin hole 105, alignment capture 106, guide frame 107, lid frame guide 108, safety pin 109, worm & wheel 110, and guide & alignment pin 111 (FIG. 1B and FIG. 2).

The process chamber lid service cart lifts up the process chamber lid with process chamber lid service frame. The cart is roughly aligned at the process chamber with guide frame 107 installed at the base frame of the process chamber. The service lid frame and the cart are aligned with guide pin 101 & 111 and alignment capture 102 & 106. Cart legs are constructed in such a way that the left leg can be inserted to the inside of the process chamber base frame and right leg outside of the process chamber base frame so that the cart can change the direction in narrow space. The shaft of the right leg can be operated by screw jack to extend/retract the leg position.

The process chamber lid is supported at the rotation shaft of the lid service frame at the middle of the lid length. The rotation shaft can be rotated by self position holding gear mechanism. When the lid is on the process chamber body, the movement of the lid service frame is supported at the lid frame guide 108 installed at the base frame of the process chamber body. When the lid is lifted up, the weight of the lid is supported by the lid service frame and, the movement of the lid and lid service frame is supported at the guide pin 101 and the alignment capture 102 of the lid service cart. In this process chamber lid service system design, the stroke of the lid lifting mechanism is long enough to lower the lid for easier maintenance.

Compared with conventional lid open/close and rotation mechanism, the present design allows the process chamber lid to be opened/closed in a very narrow maintenance space, even when the maintenance space is narrower than the length of the process chamber lid. Specifically, the lid service cart can be pulled out/pushed in slantingly against the process chamber. For conventional lid open mechanism, the clearance of the lid length is required to open the lid. Whereas for the present design, less space is required. The lid can be lowered for easy maintenance. As the lid can be rotated at the center of the gravity, less rotation torque is required and the required rotation height is 50% of conventional rotation mechanism. Usually, for conventional mechanism, rotation diameter is 2×L (L: lid length). Whereas for the present design, the rotation diameter is approximately L. Additionally, as the cart can be shared with plural process chambers, the design is less expensive.

Figure 3E:
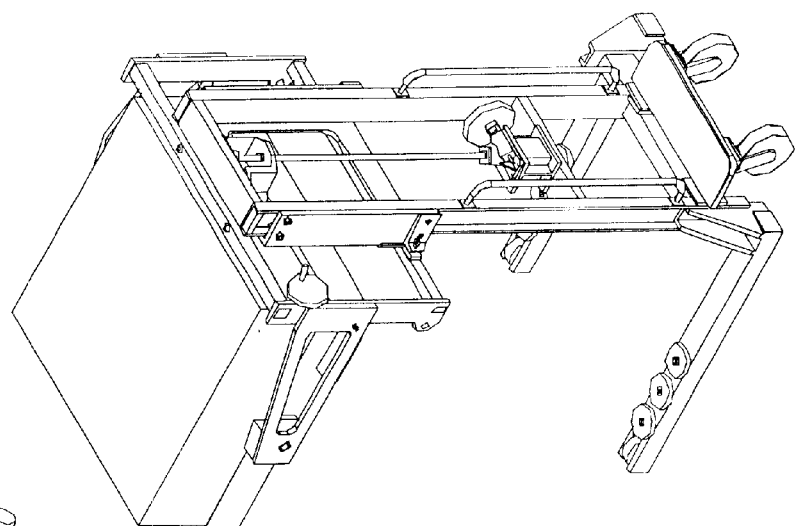
Figure 3D:
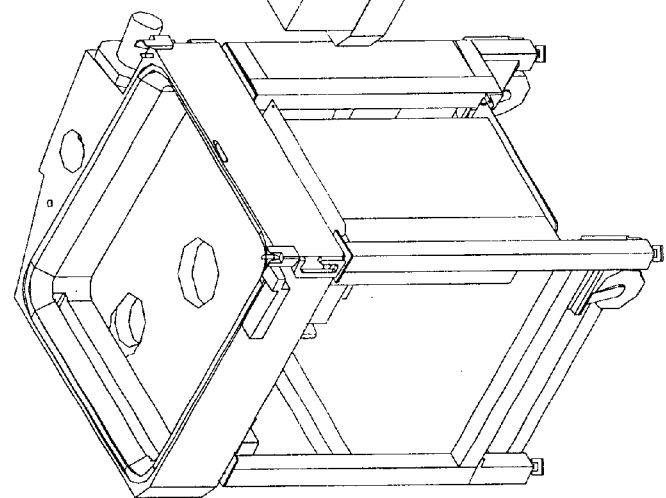
Figure 3D:
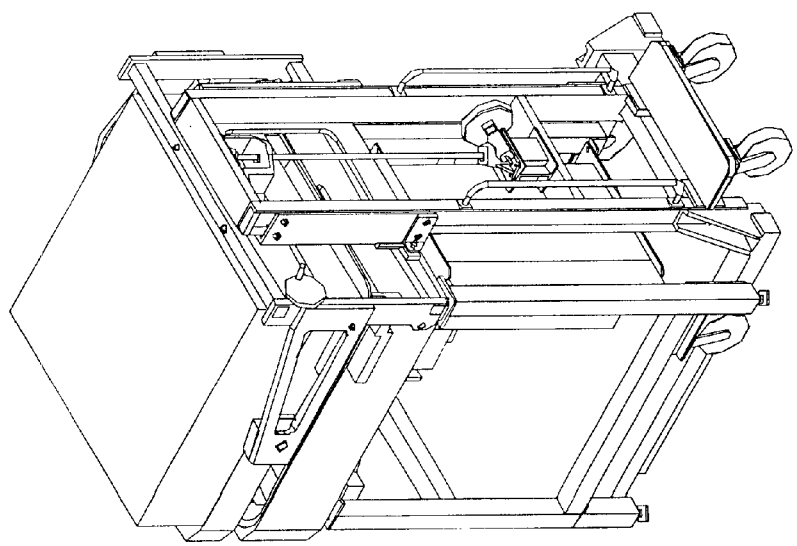
Figure 3H:
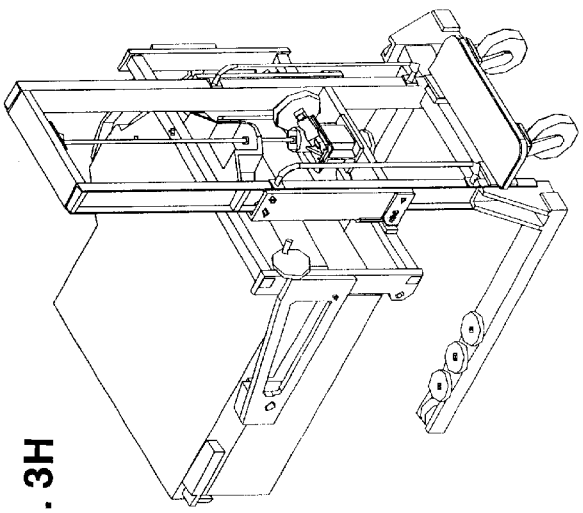
Figure 3G:
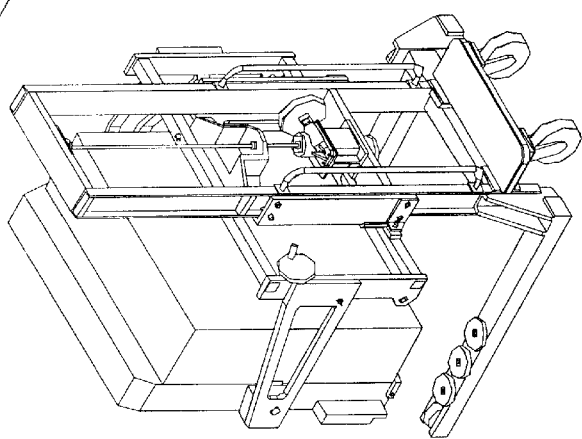
Figure 3F:
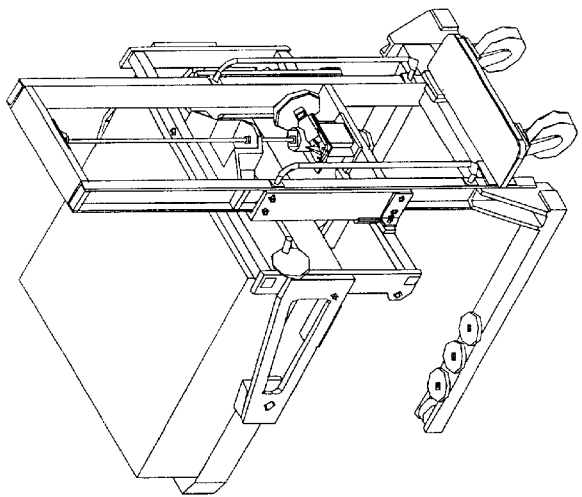
Figure 4B:
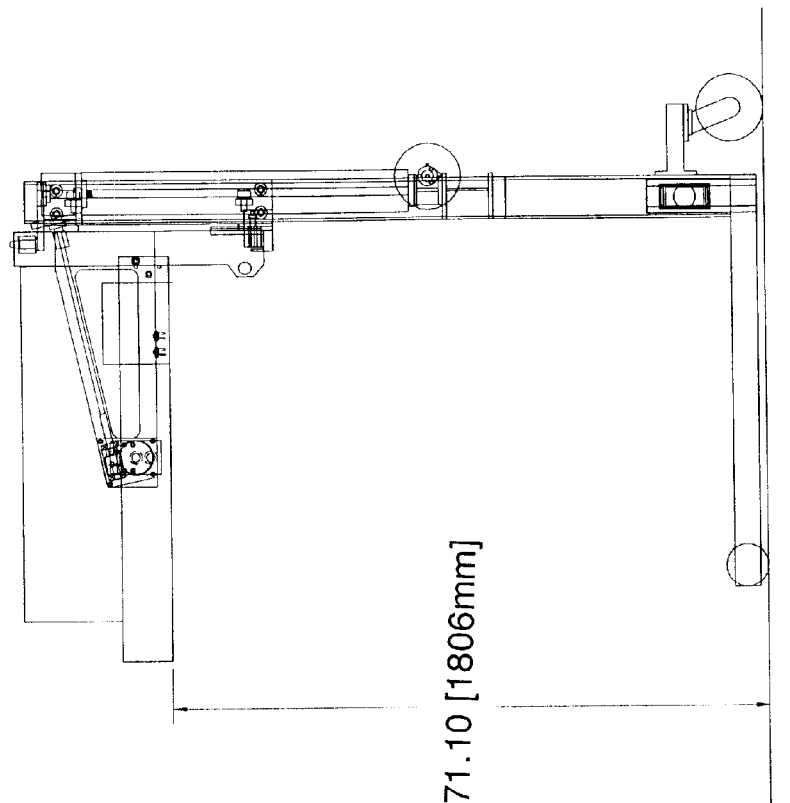
FIGS. 4A–4B show the dimension of process chamber lid service cart, including the minimum height (lower limit, FIG. 4A) and maximum height (upper limit, FIG. 4B).
Figure 4A:
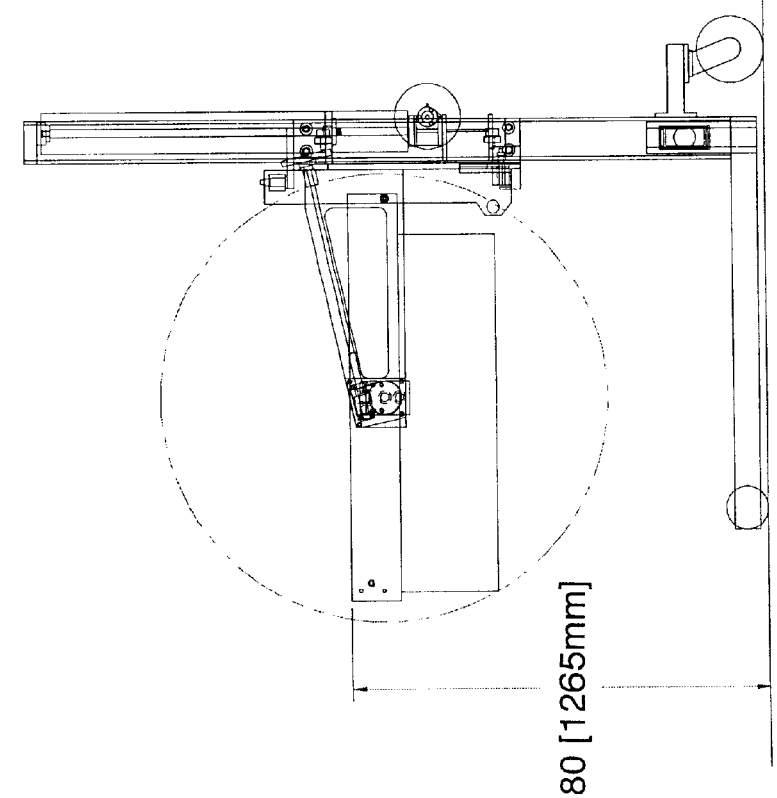

To operate the process chamber lid service system disclosed herein, the process chamber lid service cart is first inserted to align with the process chamber lid service frame and the process chamber base frame (FIGS. 3A and 3B). The lid service frame is then lifted up to the upper limit (FIGS. 3C and 3D). When the lifting is completed, the lid is then removed from the lid service frame (FIG. 3E), lowered (FIG. 3F) and rotated 180 degrees (FIGS. 3G and 3H). FIGS. 4A and 4B show the dimension of process chamber lid service cart, including the minimum height (lower limit, FIG. 4A) and maximum height (upper limit, FIG. 4B).

As described above, provided herein is a process chamber lid service system for semiconductor manufacturing. This system comprises a process chamber lid service cart and a process chamber lid service frame. The lid service frame holds the process chamber lid. The cart and the lid service frame are aligned with guide pin and alignment capture, meanwhile, the cart is aligned at the process chamber with guide frame, which is installed at the base frame of the process chamber. When the cart and the process chamber base frame are aligned, the left leg of the cart is inserted to the inside of the base frame, while the right leg is placed outside of the base frame.

Specifically, the process chamber lid is supported by a rotation shaft at the process chamber lid service frame and may be rotated up to 180 degrees. While the process chamber lid service frame is supported by lifting mechanism of the process chamber lid service cart and may be moved up and down.

The presently disclosed process chamber lid service system may be used for opening/closing a process chamber during semiconductor manufacturing. Specifically, the process chamber is in an open condition when the process chamber lid service frame is lifted up and the process chamber lid is further removed by the process chamber lid service cart, whereas the process chamber is in a closed condition when the process chamber lid service frame is placed on the process chamber. More specifically, the process chamber lid may be lifted up to an upper limit of about 1800 mm and lowered to a lower limit of about 1000 mm.

Also provided herein is a method of wet-cleaning a process chamber using the presently disclosed process chamber lid service system. This method comprises the steps of (1) inserting the process chamber lid service cart to align the cart with the process chamber lid service frame and the process chamber base frame; (2) lifting up the process chamber lid service frame; (3) removing the process chamber lid from the process chamber lid service frame, thereby breaking the vacuum seal of the process chamber; (4) lowering the process chamber lid; (5) rotating the lid 180 degrees; and (6) wiping down the process chamber using chemical cleaners.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A process chamber lid service system for semiconductor manufacturing, comprising:

a process chamber lid service cart having two legs, said legs extending horizontally from said service cart;

a process chamber lid service frame, said lid service frame holding the process chamber lid on a process chamber;

a guide frame, said guide frame positioned at a base frame of said process chamber, said guide frame guiding a first leg and a second leg of said service cart; and guide pin and alignment capture means on each of said service cart and said chamber lid service frame, wherein said means will align said service cart and said chamber lid service frame when said means are operably engaged.

2. The process chamber lid service system of claim 1, wherein the process chamber lid is supported by a rotation shaft at the process chamber lid service frame.

3. The process chamber lid service system of claim 2, wherein said process chamber lid may be rotated up to 180 degrees.

4. The process chamber lid service system of claim 1, wherein said process chamber lid service frame is supported by a lifting mechanism of said process chamber lid service cart.

5. A method of opening/closing a process chamber in semiconductor manufacturing, comprising the step of:

applying the process chamber lid service system of claim 1 in manufacturing, wherein the process chamber is in an open condition when the process chamber lid service frame is lifted up and the process chamber lid is further removed by the process chamber lid service cart, and wherein the process chamber is in a closed condition when the process chamber lid service frame is lowered onto the process chamber and the process chamber lid is returned to position on the process chamber.

6. The method of claim 5, wherein said process chamber lid is lifted to an upper limit of about 1800 mm and is lowered to a lower limit of about 1000 mm.

7. A method of wet-cleaning a process chamber using the process chamber lid service system of claim 1, comprising the steps of:

inserting the process chamber lid service cart to align the cart with the process chamber lid service frame and the process chamber base frame via the guide frame;

engaging the guide pin and alignment capture means;

lifting up the process chamber lid service frame;

removing the process chamber lid from the process chamber lid service frame, thereby breaking the vacuum seal of the process chamber;

lowering the process chamber lid;

rotating the lid 180 degrees; and wiping down the process chamber using chemical cleaners, thereby cleaning the process chamber.

8. The method of claim 7, wherein a first of the legs of the cart is inserted to the inside of the base frame of the process chamber and a second of the legs of the cart is positioned outside of the base frame of the process chamber.

* * * * *